United States Patent
Stecher et al.

(10) Patent No.: US 6,365,260 B1
(45) Date of Patent: Apr. 2, 2002

(54) ARRANGEMENT FOR HEAT DISSIPATION IN CHIP MODULES ON MULTILAYERED CERAMIC CARRIERS, IN PARTICULAR MULTICHIP MODULES

(75) Inventors: Günther Stecher, deceased, late of Leonberg, by Christa Stecher, heir; Annette Seibold, Rutesheim, both of (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/202,112

(22) PCT Filed: May 7, 1997

(86) PCT No.: PCT/DE97/00923

§ 371 Date: Jul. 8, 1999

§ 102(e) Date: Jul. 8, 1999

(87) PCT Pub. No.: WO98/00869

PCT Pub. Date: Jan. 8, 1998

(30) Foreign Application Priority Data

Jun. 29, 1996 (DE) ......................... 196 26 227

(51) Int. Cl.$^7$ ..................... H01L 23/427; B32B 3/24
(52) U.S. Cl. ................. 428/138; 428/166; 428/188; 428/178; 428/901; 174/15.2; 361/700; 165/104.26; 257/715
(58) Field of Search ................ 428/138, 166, 428/188, 178, 901; 174/15.2; 361/700; 165/104.26; 257/715

(56) References Cited

U.S. PATENT DOCUMENTS

| | | | | |
|---|---|---|---|---|
| 4,327,399 A | * | 4/1982 | Sasaki et al. | 361/385 |
| 4,612,978 A | * | 9/1986 | Cutchaw | 165/104.33 |
| 4,727,454 A | * | 2/1988 | Neidig et al. | 361/382 |
| 4,880,053 A | | 11/1989 | Sheyman | 165/104.26 |
| 5,023,695 A | * | 6/1991 | Umezawa et al. | 357/82 |
| 5,216,580 A | * | 6/1993 | Davidson | 361/385 |
| 5,271,887 A | * | 12/1993 | Wiech, Jr. | 264/61 |
| 5,306,866 A | * | 4/1994 | Gruber et al. | 174/15.1 |
| 5,390,077 A | * | 2/1995 | Paterson | 361/700 |
| 5,527,588 A | | 6/1996 | Camarda et al. | 428/188 |

FOREIGN PATENT DOCUMENTS

| | | |
|---|---|---|
| DE | 3 402 003 | 7/1985 |
| EP | 251 836 | 1/1988 |
| EP | 0 693 776 A2 | 1/1996 |

OTHER PUBLICATIONS

*IBM Technical Disclosure Bulletin*, vol. 37, No. 9, Sep. 1994, p. 171.
Y. Eastman, "The Heat Pipe," *Scientific American*, vol. 5, 1968, pp. 38–46.

* cited by examiner

Primary Examiner—William P. Watkins, III
(74) Attorney, Agent, or Firm—Kenyon & Kenyon

(57) ABSTRACT

A heat dissipation arrangement for chip modules on multilayer ceramic substrates, in particular multichip modules, in which passages for a heat-conducting medium are provided in the ceramic substrate. The multilayer ceramic substrate is mounted on a metal heat sink. Thermal passages, in particular in the form of a hole pattern or array, are provided in the top layer of the multilayer ceramic substrate, in the region of the chip to be mounted. A cavity functioning as an evaporation chamber is provided in the layer of the multilayer ceramic substrate directly beneath the top layer, in the region of the chip to be mounted, and a trough-shaped recess functioning as a condenser is provided in the metal heat sink, in the region of the chip to be mounted. In the layers of the multilayer ceramic substrate located between the evaporation chamber and the condenser, in the region of these two chambers, a series of large steam channels and small condensate channels, the latter functioning as capillaries is provided, which interconnect these two chambers. This arrangement forms a miniaturized heat pipe structure which can transport a great amount of energy per unit of time across short distances.

17 Claims, 1 Drawing Sheet

ARRANGEMENT FOR HEAT DISSIPATION IN CHIP MODULES ON MULTILAYERED CERAMIC CARRIERS, IN PARTICULAR MULTICHIP MODULES

FIELD OF THE INVENTION

The present invention relates to a heat dissipation arrangement for chip modules on multilayer ceramic substrates,

BACKGROUND INFORMATION

In a conventional heat dissipation arrangement for modules in which one or more chips are arranged on a multilayer ceramic substrate, the one or more chips, in particular the one or more power ICs, are arranged on thermal passages, or "thermal vias". These thermal passages are a regular arrangement of holes, or hole arrays, that are punched through all circuit layers and filled with silver paste. Transferring heat from the power ICs through the thermal passages to the metal base plate located beneath the multilayer ceramic substrate is not very effective. The passages punched through all circuit layers take up too much surface area that could otherwise be used by other printed conductors on the circuit layers. This reduces the packing density.

The conventional technical solution using thermal conductive modules (TCMs) developed by IBM conducts the heat output by the ICs very effectively upward at right angles to the substrate. However, this solution is too expensive for many applications.

Generally, heat pipe structures are devices that can be used to transfer quantities of heat from one point where heat is generated to another point. With a suitable design, the effective heat transport of this arrangement is tens of times higher than that of the best metal heat conductors. A description of how the heat pipe structures work is provided, e.g., in "The heat pipe" by Y. Eastman is Scientific American, 5/68, pages 38 to 46.

The principle of heat pipes can be described as follows: a suitable fluid with a high latent evaporation heat evaporates in the hot area of the arrangement. The pressure produced by evaporation drives the steam to the cold part of the arrangement. There the steam condenses, forming the liquid phase, and gives off the transported heat. The liquid condensate is then returned to the evaporation point. This establishes a circuit.

SUMMARY OF THE INVENTION

The heat dissipation arrangement for chip modules according to the present invention, has the advantage over conventional arrangements in that the principle of heat pipe is used in a miniaturized form for the effective cooling of power ICs that are mounted on relatively poorly conductive multilayer ceramic substrates, in particular glass ceramic multilayer circuits. The heat is transferred to the metal heat sink much more effectively, while retaining the packing density and circuit flexibility, since the amount of surface area needed is minimized.

According to the present invention, this is achieved, in principle, by mounting the multilayer ceramic substrate on a metal heat sink; providing thermal passages, in particular in the form of a hole pattern or array, in the top layer of the multilayer ceramic substrate, in the region of the chip to be mounted; providing a cavity functioning as an evaporation chamber in the layer of the multilayer ceramic substrate directly beneath the top layer, in the region of the chip to be mounted; providing a trough-shaped recess functioning as a condenser in the metal heat sink, in the region of the chip to be mounted; and providing, in the layers of the multilayer ceramic substrate located between the evaporation chamber and the condenser, in the region of these chambers, a series of large steam channels and small condensate channels, the latter functioning as capillaries, which interconnect the two chambers.

According to an advantageous embodiment of the present invention, a plurality of chips, in particular power ICs generating a considerable amount of waste heat, can be mounted on the multilayer ceramic substrate.

According to a further advantageous embodiment of the present invention, each trough-shaped recess functioning as a condenser and located in the multilayer ceramic substrate is provided with a closable opening for filling a heat-conducting medium.

According to an especially advantageous and easy-to-manufacture embodiment of the present invention, the large steam channels and the small condensate channels are designed as straight channels between the layers of the multilayer ceramic substrate.

According to an embodiment of the present invention as an alternative to this embodiment, which can be useful in some applications, in particular with regard to the space requirements and conductor arrangement, the small condensate channels are designed, at least in part, as angled channels, with at least a portion of these channel provided on the same plane as one or more layers of the multilayer ceramic substrate. The portion of the condensate channels provided on the plane of one or more layers can be produced in different ways. They can be produced by printing, with these portions of the channels being printed with carbon paste which is later burned off to produce the partial channels, or they can be produced by punching, milling, or embossing the channel portions in the unfired ceramic material, in particular in the ceramic tape. In an advantageous embodiment of the present invention, the large steam channels have a diameter of around 1.5 mm, and the small condensate channels have a diameter of around 0.1 mm.

In a further an embodiment embodiment of the present invention, which can help improve conduction of the condensate, the small condensate channels are filled with a porous ceramic powder or with metal frit which remains unsintered at the firing temperatures used.

To prevent direct evaporation of the condensate, according to a further advantageous embodiment of the present invention, the large steam channels can have, in the region of the condenser chamber provided in the metal heat sink, a diameter or a passage area that is smaller than the passage area of the steam channel in the more distant layers of the multilayer ceramic substrate.

In a an embodiment embodiment of the present invention, a fluid having as high an evaporation heat as possible at a suitable evaporation temperature, as well as a high surface tension and wetting angle for the capillaries, in particular alcohols and hydrocarbons, is used as the heat-conducting working fluid.

According to a further advantageous embodiment of the present invention, the one or more individual chips can be attached to the multilayer ceramic substrate using a suitable heat-conducting adhesive, and/or the multilayer ceramic substrate can be attached to the metal heat sink using a suitable heat-conducting adhesive.

DETAILED DESCRIPTION

Figure 1:
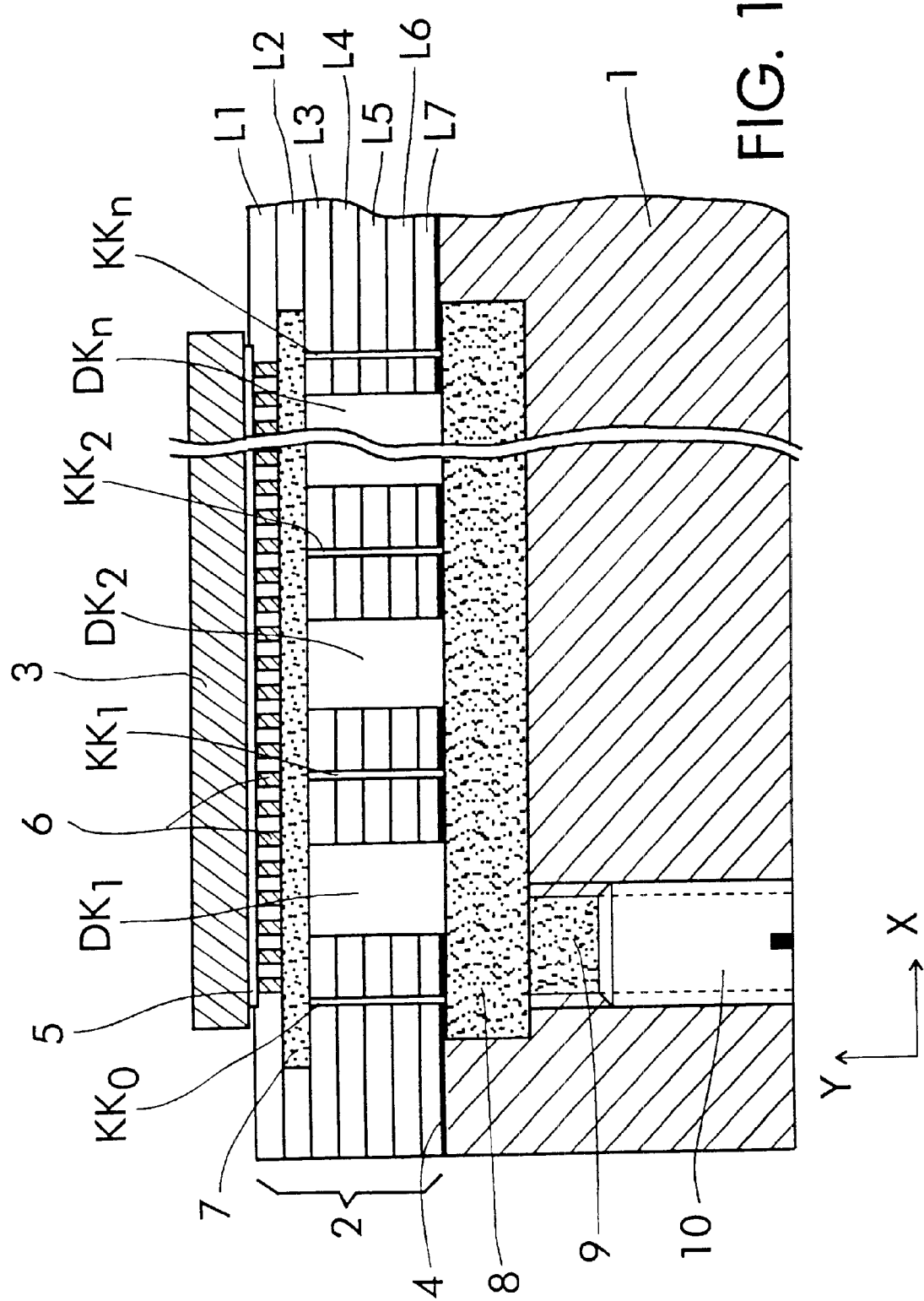
FIG. 1 shows a schematic sectional view, on the x-y plane, of a section of a multilayer ceramic substrate, which is attached to a metal heat sink and on which is mounted a chip or a power IC.

FIG. 1 illustrates the present invention through a schematic sectional view of an arrangement having a metal heat sink 1, a multilayer ceramic substrate 2, and a chip 3 mounted on the substrate. The representation is not necessarily true to scale. The dimensions along the x axis, for example, are magnified around 10 times, and the dimensions along the y axis are magnified around 40 times, so that the most important features according to the present invention can be clearly discerned. In addition, the electrical connections between chip 3 and the circuit, using bonding wire, and the electrical paths within the individual layers of multilayer ceramic substrate 2 are not shown.

Multilayer ceramic substrate 2, which has seven layers L1 through L7 in the illustrated example, is attached to metal heat sink 1 by an adhesive layer 4. Chip 3, which is a power IC (an integrated circuit which generates a relatively large amount of waste heat) whose generated waste heat is to be discharged, is also attached via an adhesive layer 5 to top layer L1 of multilayer ceramic substrate 2. The one or more adhesives used for adhesive layers 4 and 5 are capable of conducting heat.

A number of thermal passages 6 are provided in top layer L1 of multilayer ceramic substrate 2, in the region of chip 3 to be mounted and more or less along its entire length in the plane. These passages 6 can be referred to as thermal vias and are produced, for example, by punching holes in layer 1 in a regular pattern, or hole array. After these bore holes serving as passages 6 have been punched or drilled, they are filled, for example, with silver paste, in order to improve heat conduction. The bore holes or passages 6 can have a diameter of around 0.2 mm and have the same spacing between them.

A cavity 7 is provided in layer L2 of multilayer ceramic substrate 2 located directly beneath top layer L1. This cavity 7 is greater in length than the hole pattern positioned above it. It is also preferably greater in length than chip 3 to be mounted. This is illustrated in the FIG. 7. Cavity 7 can be easily formed by punching out an area of the necessary size in layer L2. Cavity 7 forms an evaporation chamber beneath chip 3, and therefore very close to the heat source. The plurality of passages 6 provide an intensive thermal link between this evaporation chamber and chip 3.

According to the present invention, metal heat sink 1 is provided with a trough-shaped recess 8 on the side facing multilayer ceramic substrate 2 in the region of chip 3 to be mounted. The area covered by this recess 8 is more or less the same as the area covered by chip 2 positioned above it. However, it can also be slightly larger, as shown in the figure. Trough-shaped recess 8 in the metal heat sink forms the condenser. In this chamber, the evaporated working fluid turns back into a liquid working fluid.

According to an important feature of the present invention, a number of large steam channels DK1–DKn and small condensate channels KK0–KKn, the latter functioning as capillaries, are provided in the layers located between cavity 7 in layer L2 forming the evaporation chamber and trough-shaped recess 8 forming the condenser, in the example shown in the figure, these are layers L3–L7 of multilayer ceramic substrate 2. These steam channels DK1–DKn and these condensate channels KK0–KKn are arranged in the region of chambers 7 and 8 and interconnect these two chambers. In the embodiment illustrated in the figure, large steam channels DK1–DKn are shown with a diameter of around 1.5 mm, and small condensate channels KK0–KKn are shown with a diameter of around 0.1 mm.

In a further embodiment of the present invention, tough-shaped recess 8 in heat sink 1, which can be produced by milling, is provided with a filling opening 9, which can be closed by a screw 10. After chip 3 is mounted, the heat-conducting medium (the evaporating and then condensing working fluid) is filled through this filling opening 9, which is located on the side of heat sink 1 opposite recess 8. The arrangement can be put into operation after closing filling opening 9 with screw 10. A fluid having as high an evaporation heat as possible at a suitable evaporation temperature and provided with a high surface tension and wetting angle for the capillaries is advantageously used as the heat-conducting working fluid. This can be, in particular, alcohols and hydrocarbons.

In the embodiment illustrated in the FIG. 1, both large steam channels DK1–DKn and small condensate channels KK0–KKn are designed as straight channels between layers L3 and L7 of multilayer ceramic substrate 2. As an alternative, it is possible to provide steam channels DK1–DKn with a smaller diameter in bottom layer D7 than in the other layers L7–L3 in order to prevent direct evaporation of condensate. It is also possible to design at least some of small condensate channels KK0–KKn as channels with horizontal segments, instead of straight channels, at least in some areas of the straight channels, so that they are positioned on the same plane as the layers, e.g., within layers of multilayer ceramic substrate 2. These capillary channels, which conduct the condensate to the evaporation chamber, are then partially provided in the layer itself. A combination of straight and angled condensate channels is also possible. This offers an especially flexible way to adapt the arrangement to circuitry needs and space requirements in individual or multiple layers.

According to another exemplary embodiment, the capillary channels that are partially provided inside a layer can be produced by printing. The channels are printed with carbon paste, which is burned off later on to form the channels. Other possible production methods are to punch out or mill out the channels. An especially suitable method is to emboss the channels in the unfired ceramic material, in particular in the ceramic tape. According to one embodiment of the present invention, bore holes KK0–KKn serving as the capillary channels (the condensate channels) can also be filled with a suitable material instead of being left empty. For example, it is possible to use porous ceramic powder or metal frit that remains unsintered at the firing temperatures used: around 900° C. This achieves a particular advantages in that the capillary forces can be influenced. It is thus possible to increase the diameter of small condensate channels KK0–KKn, thereby increasing the transported volume of condensate.

The heat dissipation arrangement for a chip 3 shown in the figure is particularly advantageous if multiple chips 3 are mounted on the same multilayer ceramic substrate 2, and this, in turn, is mounted on a heat sink 1. In particular, the packing density and heat removal effectiveness achieved in this manner is of enormous advantage. The miniaturized heat pipe structure created according to the present invention thus provides a much greater packing density and circuit design flexibility, while increasing heat dissipation. The arrangement designed according to the present invention establishes an effective heat-dissipating circuit which, with a miniaturized design, can transport a large amount of energy per unit of time across short distances.

What is claimed is:

1. A heat dissipation arrangement, comprising:

a metal heat sink having a trough-shaped recess which functions as a condenser; and a multilayer ceramic substrate mounted on the metal heat sink and including a plurality of layers, the multilayer ceramic substrate having thermal passages, for a heat-conducting medium, which are situated in a particular region of a top layer of the layers, the particular region being a region where a chip is to be mounted on the top layer, the multilayer ceramic substrate having a cavity functioning as an evaporation chamber, the cavity being situated in a particular layer of the layers disposed directly beneath the top layer at the particular region, further layers of the plurality of layers being situated between the cavity and the recess, wherein large steam channels and small condensate channels are situated in the further layers in a further region of the cavity and the recess, the small condensate channels functioning as capillaries which interconnect the cavity and the recess.

2. The arrangement according to claim 1, wherein the multilayer ceramic substrate includes a multichip module.

3. The arrangement according to claim 1, wherein the thermal passages have a shape of one of a hole pattern and a hole array.

4. The arrangement according to claim 1, wherein a plurality of chips are mounted on the multilayer ceramic substrate.

5. The arrangement according to claim 4, wherein the plurality of chips include power ICs which generate a waste heat.

6. The arrangement according to claim 1, wherein the recess has a closable opening for filling the heat-conducting medium.

7. The arrangement according to claim 1, wherein the large steam channels and the small condensate channels are designed as straight channels between the further layers.

8. The arrangement according to claim 1, wherein at least some of the small condensate channels are designed as angled channels, at least a particular portion of the angled channels and at least one of the further layers being provided on a particular plane.

9. The arrangement according to claim 8, wherein the particular portion is produced by one of a printing procedure with a carbon paste, a punching procedure, a milling procedure, and an embossing of the particular portion in an unfired ceramic material, the carbon paste being subsequently burned off to form partial channels.

10. The arrangement according to claim 9, wherein the unfired ceramic material includes a ceramic tape.

11. The arrangement according to claim 1, wherein a size of a first diameter of the large steam channels is approximately 1.5 mm and a size of a second diameter of the small condensate channels is approximately 0.1 mm.

12. The arrangement according to claim 1, wherein the small condensate channels are filled with one of a porous ceramic powder and a metal frit which remains unsintered at a firing temperature used.

13. The arrangement according to claim 1, wherein the large steam channels have one of a first diameter and a first passage area in a first region near the recess, the large steam channels having a second passage area in a second region near distant layers of the layers, one of the first diameter and the first passage area being smaller than the second passage area.

14. The arrangement according to claim 1, wherein the heat-conducting medium includes a heat-conducting working fluid which includes a fluid having a highest-possible evaporation heat at a particular evaporation temperature, the fluid having a high surface tension and a wetting angle for capillaries.

15. The arrangement according to claim 14, wherein the fluid includes alcohols and hydrocarbons.

16. The arrangement according to claim 1, further comprising:

a heat-conducting adhesive attaching the chip to the multilayer ceramic substrate.

17. The arrangement according to claim 1, further comprising:

a further heat-conducting adhesive attaching the multilayer ceramic substrate to the metal heat sink.

* * * * *

UNITED STATES PATENT AND TRADEMARK OFFICE
CERTIFICATE OF CORRECTION

PATENT NO. : 6,365,260 B1
DATED : April 2, 2002
INVENTOR(S) : Gunter Stecher et al.

It is certified that error appears in the above-identified patent and that said Letters Patent is hereby corrected as shown below:

Column 1,
Line 8, change "substrates," to -- substrates, in particular multichip modules. --.
Line 50, change "invention," to -- invention --.

Column 3,
Line 42, change "the FIG. 7." to -- FIG. 1 --.

Column 4,
Line 18, delete "the".

Signed and Sealed this

Tenth Day of June, 2003

JAMES E. ROGAN
*Director of the United States Patent and Trademark Office*